(12) United States Patent
Hashimoto et al.

(10) Patent No.: US 7,498,215 B2
(45) Date of Patent: Mar. 3, 2009

(54) METHOD OF PRODUCING PRODUCT INCLUDING SILICON WIRES

(75) Inventors: Morimi Hashimoto, Wako (JP); Eiichi Fujii, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 11/687,064

(22) Filed: Mar. 16, 2007

(65) Prior Publication Data
US 2007/0232036 A1 Oct. 4, 2007

(30) Foreign Application Priority Data
Apr. 3, 2006 (JP) .............................. 2006-101879

(51) Int. Cl.
*H01L 21/336* (2006.01)

(52) U.S. Cl. .................. 438/197; 977/762; 977/938

(58) Field of Classification Search ................. 438/500; 977/723, 726, 938; 313/233
See application file for complete search history.

(56) References Cited

U.S. PATENT DOCUMENTS

| 6,036,774 | A | 3/2000 | Lieber et al. |
| 6,741,019 | B1 * | 5/2004 | Filas et al. .................. 313/355 |
| 6,872,645 | B2 | 3/2005 | Duan et al. |
| 6,882,051 | B2 | 4/2005 | Majumdar et al. |
| 6,921,462 | B2 * | 7/2005 | Montgomery et al. ....... 204/164 |

OTHER PUBLICATIONS

Charles Lieber et al., Diameter-cntrolled Synthesis of Single-cystal Silicon Nanowires, Applied Physics Letters, Apr. 9, 2001, pp. 2214-2216, vol. 78, No. 15.

* cited by examiner

*Primary Examiner*—W. David Coleman
*Assistant Examiner*—Shaka Scarlett
(74) *Attorney, Agent, or Firm*—Morgan & Finnegan, L.L.P.

(57) ABSTRACT

Provided is a product including a group of a plurality of wires, in which longitudinal directions of the wires are arranged in one direction, and a method of producing the same. The longitudinal directions of a plurality of wires each covered with a polymer are arranged in one direction in a solvent, and the plurality of the wires whose longitudinal directions are arranged in one direction is fixed by using the polymer.

8 Claims, 4 Drawing Sheets

FIG. 5
PRIOR ART
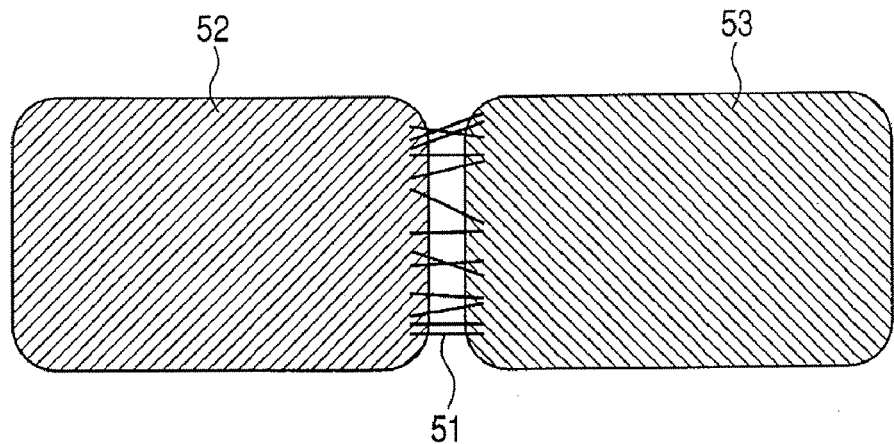
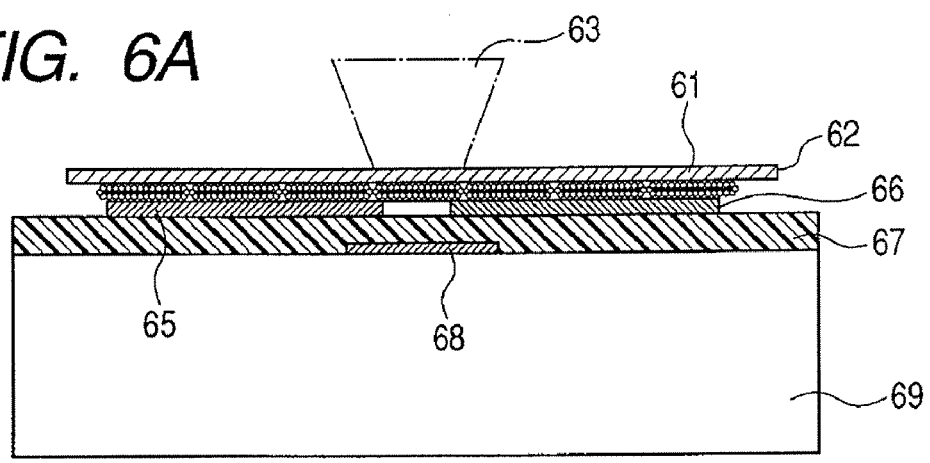
FIG. 6A
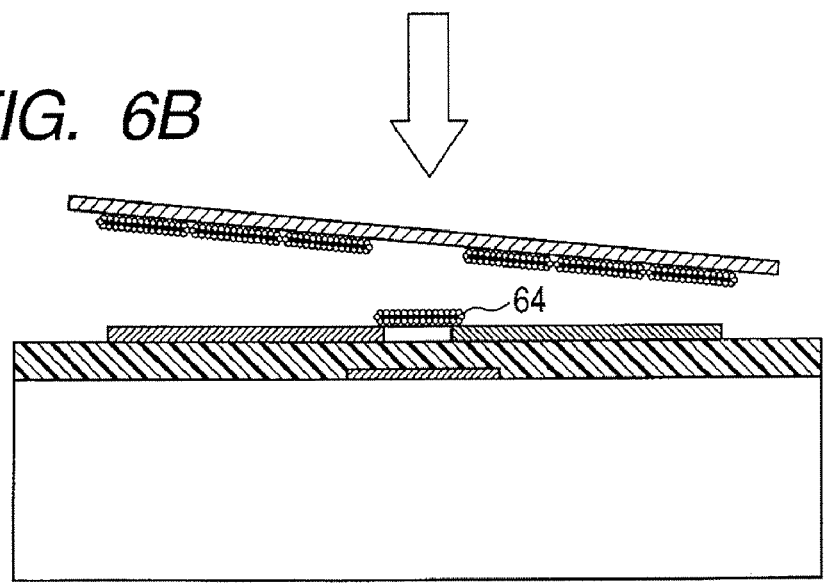
FIG. 6B

METHOD OF PRODUCING PRODUCT INCLUDING SILICON WIRES

BACKGROUND OF THE INVENTION

1. Field of the Invention

The present invention relates to a product including silicon wires and a method of producing the same.

2. Description of the Related Art

Silicon wires are wire-like molecules having diameters of several nanometers to several tens nanometers, specifically, 2 nm to 30 nm, for example, and lengths of 0.05 micrometers to several hundreds micrometers, specifically, 0.1 µm to 300 µm, for example.

The silicon wires are sometimes referred to as "silicon nanowires" because they are of sizes of the nano-order.

A silicon wire is formed by a production method therefor involving, for example, allowing Au nanoparticles to be monodispersed on a silicon wafer, and allowing Si to grow in $SiH_4$ gas through high-temperature chemical vapor deposition (high-temperature CVD) by using as a catalyst the monodispersed Au nanoparticles (see, Charles Lieber, Appl. Phys. Lett., 78, 2214-2216 (2001)).

The silicon nanowires are characterized in that they are extremely thin and long, they have structural stability and excellent electrical property, and their electrical properties are easily controlled.

From the viewpoints of such characteristics, the silicon nanowires are expected to be utilized as an electronic material.

For example, as shown in FIG. 4, high performance transistors can be produced by conducting doping to a silicon nanowire 41 to form an n-p-n junction and providing a gate insulating film 44 and electrodes. In FIG. 4, a reference numeral 42 denotes a source electrode, a reference numeral 43 denotes a drain electrode, a reference numeral 45 denotes a gate electrode, a reference numeral 46 denotes a TFT substrate, a reference numeral 47 denotes a semiconductor layer, and a reference numeral 48 denotes a protective layer.

The silicon nanowires are extremely thin. Therefore, as shown in FIG. 5, silicon nanowires 51 are sometimes arranged on electrodes at various angles between devices (in FIG. 5, a source electrode 52 and a drain electrode 53).

SUMMARY OF THE INVENTION

Accordingly, the present invention provides a product including a plurality of silicon wires aligned in a particular direction, and a method of producing the same.

According to a first aspect of the present invention, there is provided a method of producing a product including silicon wires, including: arranging longitudinal directions of a plurality of silicon wires each covered with a polymer in a solution in one direction; and fixing the plurality of the silicon wires whose longitudinal directions are arranged in one direction by using the polymer.

According to a second aspect of the present invention, there is provided a method of producing a product including silicon wires, including: covering a plurality of silicon wires with a hydrophobic polymer having affinity to the silicon wires in a solvent; applying at least one of an alternating electric field and an alternating magnetic field to the plurality of silicon wires each covered with the hydrophobic polymer; and fixing a group of the plurality of silicon wires each covered with the hydrophobic polymer by applying thereto one of an ultraviolet ray and an infrared ray or by applying heat.

In this case, before the group of the silicon wires is fixed, the group of the silicon wires can be scooped up on a substrate from the solvent and then be fixed.

According to a third aspect of the present invention, there is provided a method of producing a product including a plurality of wires, including: arranging longitudinal directions of a plurality of wires each covered with a polymer in a solution in one direction; and fixing the plurality of wires whose longitudinal directions are arranged in one direction by using the polymer.

According to a fourth aspect of the present invention, there is provided a product including a plurality of silicon wires, in which longitudinal directions of the silicon wires are arranged in one direction and the silicon wires are fixed with one another via a polymer.

Alternatively, another aspect of the present invention includes the steps of: stirring the silicon nanowires and the hydrophobic polymer having affinity to the silicon nanowires in a solvent to cover the silicon nanowires with the hydrophobic polymer having affinity to the silicon nanowires; applying one of an alternating electric field and an alternating magnetic field to the silicon nanowires each covered with the hydrophobic polymer having affinity to the silicon nanowires in a solvent having a polarity opposite to that of the silicon nanowires; and fixing the silicon nanowires each covered with the hydrophobic polymer having affinity to the silicon nanowires by applying one of an ultraviolet ray and an infrared ray or by applying heat, wherein the silicon nanowires each covered with the hydrophobic polymer having affinity to the silicon nanowires are aligned in a uniform direction through the step of applying one of an alternating electric field and an alternating magnetic field.

As described above, according to the present invention, there are provided a product including silicon wires aligned in a particular direction, and a method of producing the same.

Further features of the present invention will become apparent from the following description of exemplary embodiments with reference to the attached drawings.

BRIEF DESCRIPTION OF THE DRAWINGS

FIG. 5 shows an arrangement of silicon wires of a conventional example and Comparative Example 1.

FIGS. 6A and 6B show a process of transferring the silicon wire sheet or the silicon wire ribbon of the present invention onto a device.

DESCRIPTION OF THE EMBODIMENTS

Figure 1A:
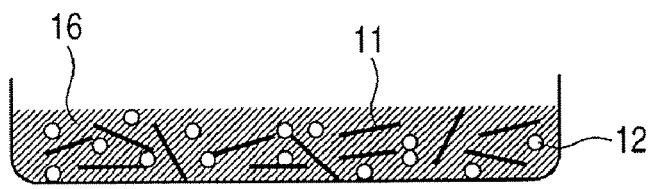
FIGS. 1A, 1B, 1C, 1D and 1E show a method of producing a silicon wire sheet or a silicon wire ribbon of the present invention (Example 1).

Now, the product including silicon wires and a production method therefor of the present invention will be described by referring to FIGS. 1A, 1B, 1C, 1D and 1E.

In the present invention, the silicon wires are wire-like molecules having diameters of several nanometers to several tens nanometers, specifically, 2 nm to 30 nm, for example, and lengths of 0.05 micrometers to several hundreds micrometers, specifically, 0.1 µm to 300 µm, for example. Since the silicon wires are of the nano-meter order, they are sometimes referred to as "silicon nanowires" hereinafter.

(Production Method)

Descriptions are given to the method of producing the product including silicon wires.

First, longitudinal directions of a plurality of silicon wires each covered with a polymer are arranged in one direction in a solution.

Then, the plurality of the silicon wires whose longitudinal directions are arranged in one direction is fixed by using the polymer.

Thus, a group of silicon wires in which the plurality of the silicon wires are orientated in a particular direction is obtained.

The polymer to be used in the present invention is not particularly limited as long as it can be used for the fixation in a later step. Covering with the polymer is performed, for example, as described below.

A silicon wire is covered with a hydrophobic polymer having affinity to the silicon wire in a solvent. More specific descriptions are given hereinlater.

For arranging the longitudinal directions of the plurality of the silicon wires each covered with the polymer in one direction, at least one of an alternating electric field and an alternating magnetic field is used, for example.

The group of the plurality of silicon wires each covered with the polymer is irradiated with one of an ultraviolet ray and an infrared ray or heated to fix the group of the silicon wires.

Note that, at least one of an alternating electric field and an alternating magnetic field can be applied to the silicon wires in a solvent having a polarity opposite to that of the silicon wires.

The application of one of the alternating electric field and the alternating magnetic field allows the group of the silicon wires to align in one direction.

Any one of polymers having insulating property can be used as the polymer.

Note that, the group of the silicon wires can be scooped up on a substrate from a solvent before the group of the silicon wires is fixed.

Descriptions are given by taking the silicon wires as an example. However, the present invention is not particularly limited to wires of silicon. For example, carbon nanotubes, and any one of wires and wire-like products each including a compound semiconductor such as SiGe and GaAs can be used.

According to the present invention as described above, there can be provided a product including a plurality of silicon wires, in which longitudinal directions of the plurality of the silicon wires are arranged in one direction and fixed with one another via a polymer.

Note that, each of the silicon wires sometimes has a natural oxide film or an oxide film formed through oxidization of a surface layer thereof provided on the surface thereof. The silicon wires to be used in the present invention of course encompass wires each having an oxide film on a surface thereof.

Hereinafter, the method of producing the product of the present invention is described in detail by referring to the drawings. However, the present invention is not limited to the following production method.

First, as shown in FIG. 1A, a silicon nanowire 11 and a hydrophobic polymer 12 having affinity to the silicon nanowire are dispersed in a solvent.

Figure 1B:
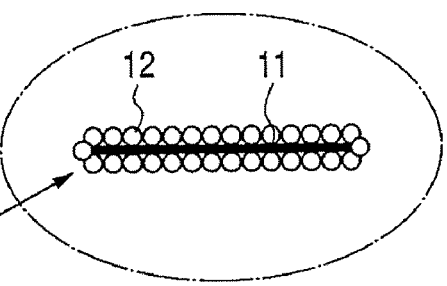
Figure 1B:

Next, as shown in FIG. 1B, the silicon nanowire is each covered with the polymer (FIG. 1BP) by stirring the solution a of FIG. 1A.

Figure 1C:
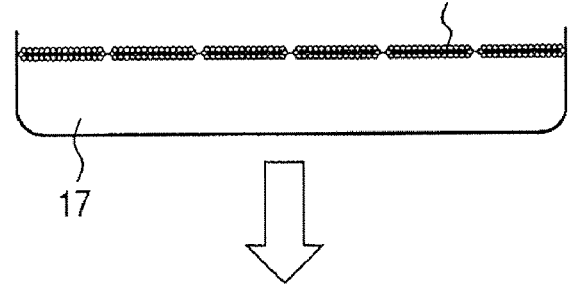

Next, the silicon nanowire covered with the polymer is dispersed in a solution of a solvent 16 (FIG. 1A) having a polarity opposite to that of the silicon nanowire. The solution is then applied with one of an alternating electric field and an alternating magnetic field at a frequency of several MHz, whereby silicon nanowire polymers 13 are aligned in a monolayer on a surface of the solution as shown in FIG. 1C.

Next, the aligned silicon nanowire polymers 13 are irradiated with any one of an ultraviolet ray 14 and the like to cause one of crosslinking reaction and polymerization reaction, to thereby fix the aligned silicon nanowire polymers. The fixation may be performed by using an infrared ray or by heating.

By the method as described above, there can be formed one of a silicon nanowire sheet 15 and a silicon nanowire ribbon 15 in which the silicon nanowires are aligned.

In this case, the reasons for covering the silicon nanowire 11 with the polymer 12 are as follows: (1) the silicon nanowires do not overlap with one another; (2) insulating property can be ensured; (3) good dispersibility in a solvent can be attained; (4) a monomolecular arrangement (LB film formation) is easily formed; (5) a structured material can be fixed by one of the crosslinking reaction and the polymerization reaction of the polymers; and the like.

For the polymer 12, any kind of polymers can be used as long as they have affinity to the surface of the silicon nanowire 11. For example, it is preferable to use a polymer having one of a Si atom and a π-conjugated bond in its molecular skeleton. In addition, examples of an insulating polymer include polyethylene, polystyrene, and polyethylene terephthalate. In addition, examples of polymers which strongly bind to one another by one of the crosslinking reaction and the polymerization reaction preferably include polyarylene ethynylene, polydiacetylene, polyvinyl pyridine, and polydibenzodisilazepine.

For fixing the silicon nanowire polymers 13, one of the crosslinking reaction and the polymerization reaction of the polymers is used. One of irradiation with one of an ultraviolet ray and an infrared ray and application of heat is selected depending on the kind of the polymer.

Figure 2A:
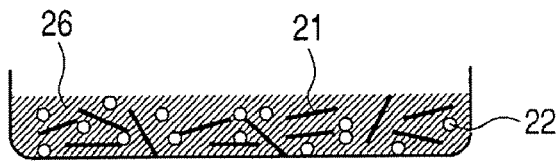
FIGS. 2A, 2B, 2C, 2D and 2E show a method of forming a silicon wire sheet or a silicon wire ribbon of the present invention on a substrate (Example 2).
Figure 2B:
Figure 2B:
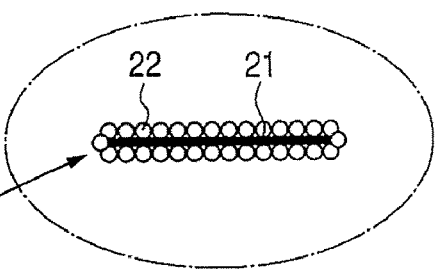
Figure 2C:
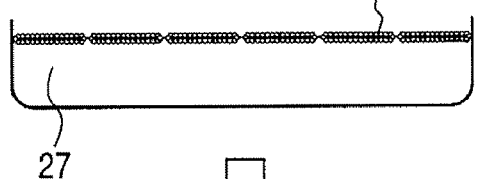

For solvent 16 (26 in FIG. 2A), any kind of solvents can be used as long as they can dissolve the polymer. Examples of the solvent include 1,2-dichloroethane and tetrahydrofuran.

Figure 2D:
Figure 3:
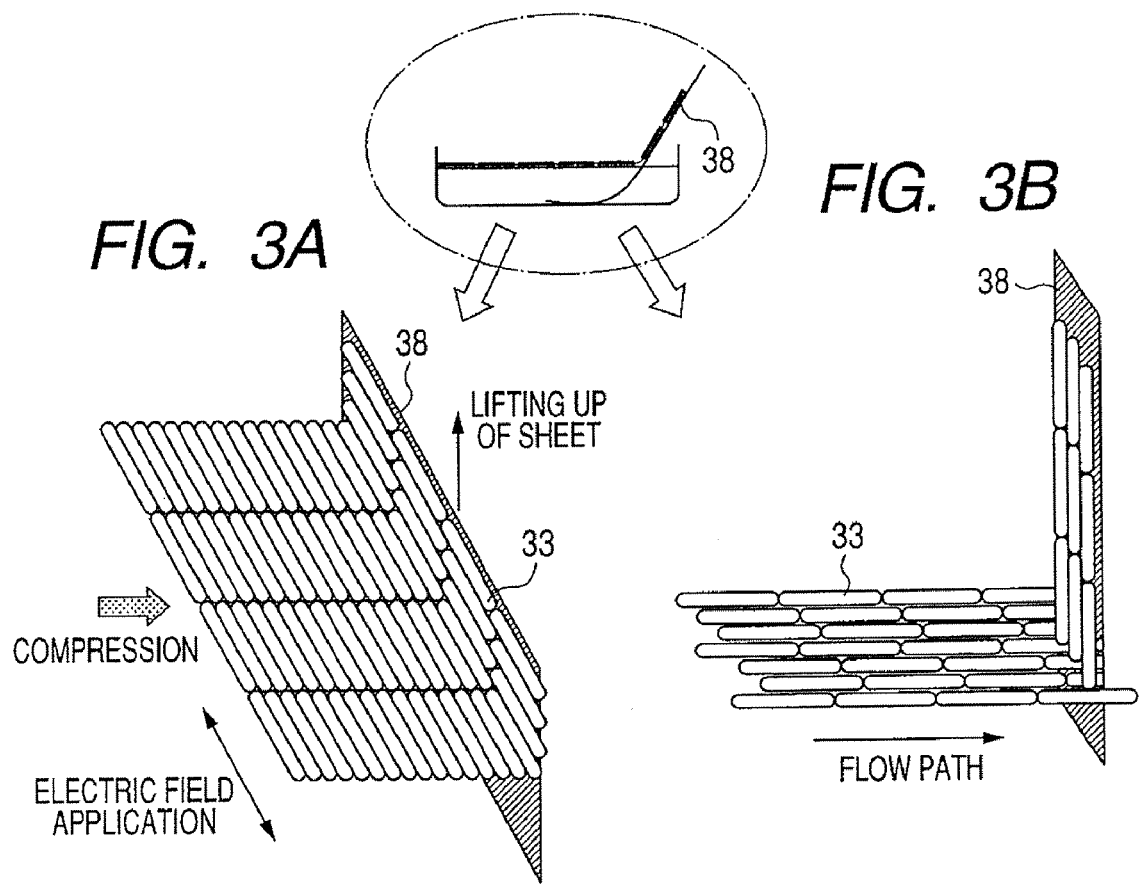
FIGS. 3A and 3B show the method of forming a silicon wire sheet or a silicon wire ribbon of the present invention on a substrate (Example 2).
Figure 4:
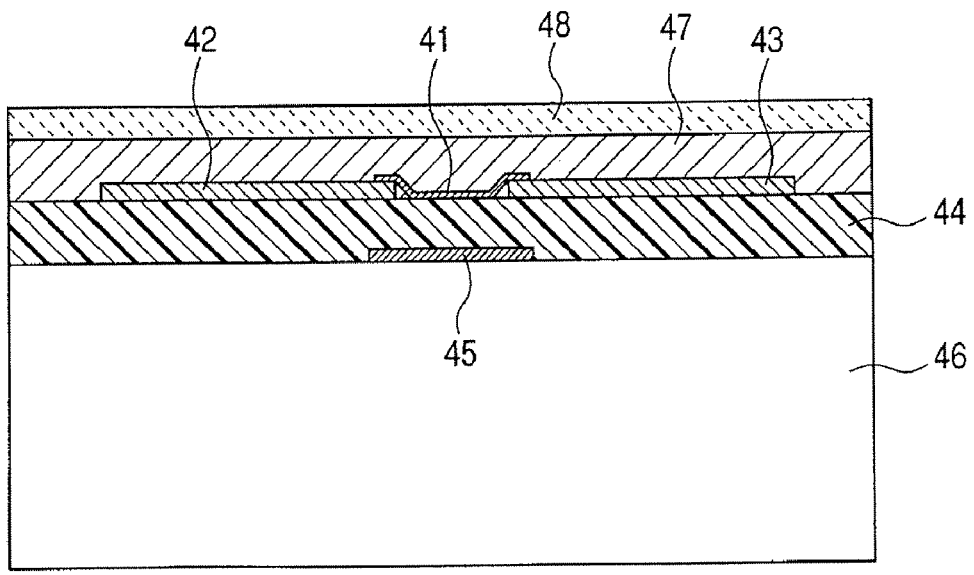
FIG. 4 shows a structure of a TFT device using the silicon wires of the present invention.

For a procedure of forming the silicon nanowire sheet or ribbon 15 on a substrate such as glass, a flexible substrate such as tape or a sheet, or the like, the Langmuir-Blodgett (LB) method is typically used. By the procedure, as shown in FIG. 2D, polymers aligned in a monomolecular film on an aqueous solution 27 are scooped up on a substrate 28 from the surface of the aqueous solution, and the monomolecular arrangement of the polymers can be directly transferred onto the substrate. The silicon nanowires 21 can be aligned in such a manner that longitudinal directions thereof are perpendicular to the direction of lifting-up of the substrate as shown in FIG. 3A. Alternatively, the silicon nanowires can be aligned in such a manner that the longitudinal directions thereof are parallel to the direction of lifting-up of the substrate as shown in FIG. 3B. In the case of FIG. 3A, the longitudinal directions of the polymers can be controlled by the direction of one of the electric field and magnetic field to be applied. In the case of FIG. 3B, silicon nanowire polymers 33 are naturally aligned approximately in a direction of a flow path, and are scooped up on a substrate 38 by moving the substrate in a direction parallel to the direction of the flow path.

Figure 2E:
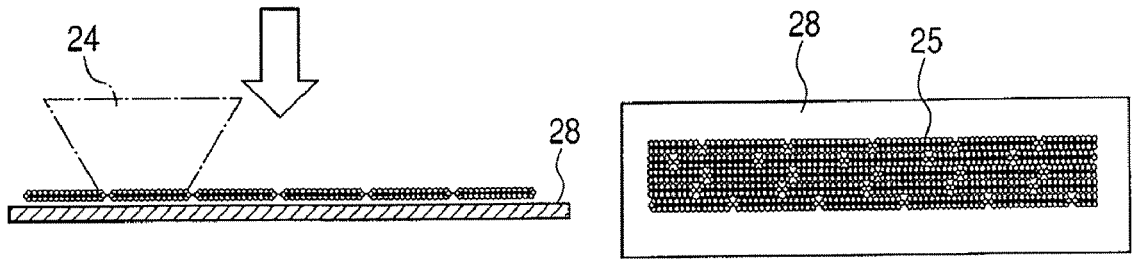

As described above, in the case where the silicon nanowire polymers 23 are formed on the substrate by one of the procedures of FIGS. 3A and 3B, the silicon nanowire polymers are formed as shown in FIG. 2D. That is, the silicon nanowire sheet or ribbon 25 is scooped up on the substrate 28, and then irradiated with an ultraviolet ray 24 or the like as shown in FIG. 2E to cause one of crosslinking reaction and polymerization reaction of the polymers 22, whereby a sheet or ribbon structured material is fixed.

Reasons for forming the silicon nanowire sheet or ribbon 25 on a substrate such as glass or a flexible substrate such as a tape or a sheet are as follows: handling of the sheet or ribbon is easy; a silicon nanowire structured material not depending on a substrate can be produced; in a case where a silicon nanowire is formed directly on a device, the device can be prevented from being damaged; the area of the sheet or ribbon can be efficiently used; and the like.

In addition, silicon nanowires preferably form a monolayer rather than a multilayer because electrical property thereof in the monolayer is stable. However, the present invention is not limited to Si wires of a monolayer or a multilayer. In addition, Si wires of the present invention may be doped with impurities. Thus, Si wires of the n-type or the p-type can be applied to the present invention. Further, the Si wires may each have an oxide film including a natural oxide film provided on a surface of the Si wire.

The entire disclosure of U.S. Pat. Nos. 6,882,051, 6,036,774, 6,872,645 and 6,835,613 is expressly incorporated herein by reference.

In addition, according to the present invention, there is provided a product including a plurality of silicon wires orientated in a particular direction. In this case, the term "orientation" means that the longitudinal directions of the plurality of the Si wires are arranged in one direction.

The wires can be used for a channel of a field-effect transistor. For example, a group of the orientated Si wires are arranged between a source electrode and a drain electrode, and the orientated Si wires are used as a channel of a TFT. The term "group of Si wires" means a plurality of wires, that is, at least 2 wires.

In addition, the wires are described by taking the silicon wires as an example. However, the present invention is not limited to the silicon wires, and can be applied to carbon nanotubes and nanowires including a compound semiconductor.

EXAMPLES

Hereinafter, specific examples of the present invention will be described in detail. However, the present invention is not limited to these examples.

Example 1

First, Au nanoparticles each having a diameter of about 20 nm were allowed to be monodispersed on a silicon wafer, and Si was allowed to grow in $SiH_4$ gas through high-temperature CVD by using the monodispersed Au nanoparticles as catalysts to form silicon nanowires. The thus-obtained silicon nanowires each had a diameter of about 50 nm and a length of about 5 μm.

Next, the silicon nanowires produced by the above-mentioned procedure were put into a solvent together with a polymer as shown in FIG. 1A, and the mixture was stirred for about 1 minutes by means of ultrasonic and then left standing. In this case, polydibenzodisilazepine was used as the polymer, and 1,2-dichloroethane was used as the solvent. In the solvent after being stirred by means of ultrasonic and left standing, each of the silicon nanowires was covered with the polymer (polydibenzodisilazepine) and dispersed throughout the solvent as shown in FIG. 1B.

Figure 1D:
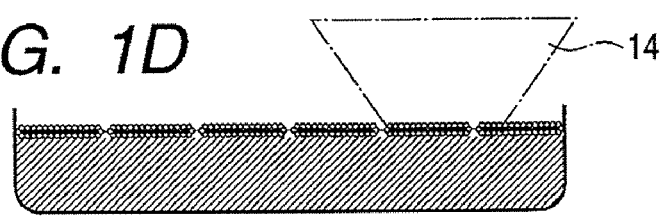
Figure 1E:

Next, the silicon nanowires each covered with the polymer were taken out from the solvent and put into a solvent b17 with affinity (in this case, an aqueous IPA solution), whereby the silicon nanowires each covered with the polymer floated on the surface of the solvent (FIG. 1C) Subsequently, an alternating magnetic field (1 MHz) of 500 oersteds was applied thereto, and the silicon nanowires each covered with the polymer were then aligned as shown in FIGS. 1D and 1E.

Next, the silicon nanowires were irradiated with an ultraviolet ray 14 for about 1 minutes to allow crosslinking reaction of the polymer to proceed, to thereby fix the aligned silicon nanowires 15 (FIG. 1E).

Accordingly, a sheet in which silicon nanowires are aligned and arranged was formed by the present invention (FIG. 1E).

Example 2

The sheet (monolayer) formed of the silicon nanowires each of which was covered with the polymer and which were floated and aligned on the solvent with affinity, as described in Example 1 (FIG. 1C), was scooped up and taken out therefrom on a polyethylene terephthalate (PET) substrate having a thickness of 100 μm (FIG. 2D). As shown in FIG. 3A, the sheet formed of the silicon nanowires each covered with the polymer was scooped up in such a manner that the alignment direction of the silicon nanowires was perpendicular to the direction of scooping-up of the PET substrate. In other words, the silicon nanowires 33 each covered with the polymer were arranged in a direction parallel to the applied electric field. Meanwhile, with respect to the LB film, the silicon nanowires were aligned by applying compression force in a direction perpendicular to the longitudinal directions of the silicon nanowires, and then the substrate was scooped up by moving the substrate in the same direction as that of the compression.

The silicon nanowires aligned and arranged on the PET substrate as described above was irradiated with an ultraviolet ray for 1 minute (FIG. 2E), whereby the polymer covering the silicon nanowires was subjected to crosslinking reaction to fix the sheet.

Accordingly, a sheet 25 formed of the silicon nanowires aligned and arranged on the substrate 28 was formed by the present invention.

Example 3

The sheet formed of silicon nanowires each covered with the polymer and formed on PET (on the PET, an intermediate layer which sublimes by irradiation with a laser was formed (not shown)) as described in Example 2 was turned upside-down and placed on electrodes (a source electrode 65, a drain electrode 66, and a gate electrode 68) after formation of the electrodes as shown in FIG. 6A. A laser 63 was applied from above a top surface (substrate side) only to a part where the silicon nanowires were intended to be arranged. The intermediate layer at the part where the laser was applied sublimed by heat, and only silicon nanowires 64 each covered with the polymer in this area was transferred onto the electrode side (FIG. 6B). In other words, the silicon nanowire sheet 61 formed on the PET substrate 62 was successfully transferred onto the part where the silicon nanowire sheet 61 was intended to be arranged (in FIG. 6A, reference numerals 67 and 69 denote an insulating layer and a TFT substrate, respectively).

Accordingly, the silicon nanowire sheet (without a substrate) of Example 1 was successfully transferred onto a desired position on a device by the present invention.

Namely, according to the present invention, there can be formed a transistor of parallel connection in which aligned silicon nanowires are formed at a desired position. In addition, since a plurality of the transistor devices can be simultaneously produced on a glass substrate, the transistor devices can be used as switching transistors for pixels of various displays, for example.

Example 4

For the sheet (LB film) of the silicon nanowires aligned in a monolayer on the solution as described in Example 1, using as a substrate a device having electrodes formed thereon, a mask (not shown) in which an opening was provided on a part where the silicon nanowires were intended to be arranged was prepared. The silicon nanowire sheet was applied and formed onto the desired position on the substrate by the LB method. In this case, the direction of alignment of the silicon nanowires was set to a direction from an electrode to another electrode (the same direction as shown in FIG. 6B). Next, unnecessary silicon nanowires formed on the electrodes were removed by dry etching.

Accordingly, the silicon nanowire sheet (without a substrate) of Example 1 was successfully arranged and formed at a desired position of a device.

Comparative Example 1

Without covering the silicon nanowires formed in Examples 1 and 4 with the polymer, a silicon nanowire film was formed on a substrate by utilizing only a flow of a solution (allowing the silicon nanowires to be aligned approximately in the direction of the flow path), that is, the so-called LB method (FIG. 2D). As a result, as shown in FIG. 5, there were a number of the silicon nanowires 51 which overlapped with or crossed over one another. In other words, in the present comparative example, there were formed devices having significant unevenness in electrical characteristics among the devices, which depend on unevenness in channel-to-channel distances or unevenness in distances from the gate electrode.

According to the present invention, the silicon nanowires can be aligned in a uniform direction. Thus, the silicon nanowires can be applied to transistors, whereby high-performance quantum apparatuses and advanced electric apparatuses having stable electrical characteristics can be produced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-101879, filed Apr. 3, 2006, which is hereby incorporated by reference herein in its entirety.

What is claimed is:

1. A method of producing a product including silicon wires, comprising:

dispersing the silicon wires, which are covered with a hydrophobic insulating polymer solution, in a solvent having a polarity opposite to that of the silicon wires;

arranging longitudinal directions of the silicon wires so that each one of the silicon wires is positioned end to end to one another;

fixing the silicon wires whose longitudinal directions are arranged end to end to one another by using one of a crosslinking reaction and a polymerization reaction of the polymer, and collecting the silicon wires fixed in accordance with said fixing step by forming one of a silicon wire monolayer sheet and a silicon wire monolayer ribbon on a substrate.

2. A method of producing a product including silicon wires, comprising:

dispersing the silicon wires, which are covered with a hydrophobic polymer having affinity to the silicon wires, in a solvent;

arranging the silicon wires so that each one of the silicon wires is positioned end to end to one another, by applying at least one of an alternating electric field and an alternating magnetic field to the silicon wires fixing a group of the silicon wires by applying thereto one of an ultraviolet ray and an infrared ray or by applying heat; and collecting the group of silicon wires fixed in accordance with said fixing step by forming one of a silicon wire sheet and a silicon wire ribbon on a substrate.

3. A method of producing a product including silicon wires according to claim 2, wherein the step of applying at least one of an alternating electric field and an alternating magnetic field to the silicon wires is conducted in a solvent having a polarity opposite to that of the silicon wires.

4. A method of producing a product including silicon wires according to claim 2, wherein the group of the silicon wires are aligned in a uniform direction by applying one of an alternating electric field and an alternating magnetic field.

5. A method of producing a product including silicon wires according to claim 2, wherein the polymer has insulating property.

6. A method of producing a product including silicon wires according to claim 2, wherein the group of the silicon wires is scooped up on a substrate from the solvent before the group of the silicon wires is fixed.

7. A method of producing a product including silicon wires according to claim 2, wherein the group of the silicon wires is of a monolayer.

8. A method of producing a product including a plurality of wires, comprising:

covering each one of said plurality of wires with a hydrophobic insulating polymer solution:

arranging longitudinal directions of said plurality of wires so that each one of said plurality of wires is positioned end to end to one another;

fixing the plurality of wires whose longitudinal directions are arranged end to end to one another by using one of a crosslinking reaction and a polymerization reaction of the polymer; and collecting the plurality of wires fixed in accordance with said fixing step by forming one of a wire sheet and a wire ribbon on a substrate.

* * * * *